US008161334B1

(12) United States Patent
Hulbert et al.

(10) Patent No.: US 8,161,334 B1
(45) Date of Patent: Apr. 17, 2012

(54) EXTERNALLY MAINTAINED REMAP INFORMATION

(75) Inventors: Jared E. Hulbert, Shingle Springs, CA (US); Samuel David Post, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 366 days.

(21) Appl. No.: 12/495,032

(22) Filed: Jun. 30, 2009

(51) Int. Cl.
*G11C 29/00* (2006.01)

(52) U.S. Cl. .......................... 714/723; 714/764

(58) Field of Classification Search .................. 365/201; 714/718, 733, 723, 710, 764
See application file for complete search history.

(56) References Cited

U.S. PATENT DOCUMENTS

| 5,764,878 A | * | 6/1998 | Kablanian et al. ........... 714/6.11 |
| 5,974,564 A | * | 10/1999 | Jeddeloh ....................... 714/6.13 |
| 6,236,602 B1 | * | 5/2001 | Patti .............................. 365/201 |
| 6,651,202 B1 | * | 11/2003 | Phan ............................. 714/733 |
| 7,757,135 B2 | * | 7/2010 | Nadeau-Dostie et al. .... 714/723 |
| 7,908,530 B2 | * | 3/2011 | Chen ............................. 714/718 |

OTHER PUBLICATIONS

Patent Application filed Jun. 30, 2009 in co-pending U.S. Appl. No. 12/494,830, 34 pages.
Patent Application filed Jun. 30, 2009 in co-pending U.S. Appl. No. 12/494,904, 31 pages.
Patent Application filed Jun. 30, 2009 in co-pending U.S. Appl. No. 12/494,994, 49 pages.
Patent Application filed Jun. 30, 2009 in co-pending U.S. Appl. No. 12/495,081, 31 pages.
Patent Application filed Jun. 30, 2009 in co-pending U.S. Appl. No. 12/494,950, 36 pages.

* cited by examiner

*Primary Examiner* — David Ton
(74) *Attorney, Agent, or Firm* — Berkeley Law & Technology Group, LLP (57) ABSTRACT

Disclosed is a system comprising a memory device, a controller to maintain remap information regarding the memory device, and a storage unit to store the maintained remap information, wherein the storage unit is external to the memory device and the controller.

21 Claims, 7 Drawing Sheets

| Received address | Remapped | Remapped address | Remap vector |
|---|---|---|---|
| addr1 | yes | addr1' | vector1 |
| addr2 | no | - | |
| addr3 | no | - | |
| addr4 | no | - | |
| addr5 | yes | addr5' | vector5 |
| addr6 | no | - | |
| addr7 | yes | addr7' | vector7 |
| addr8 | yes | addr8' | vector8 |
| ⋮ | ⋮ | ⋮ | ⋮ |

EXTERNALLY MAINTAINED REMAP INFORMATION

BACKGROUND

1. Field

Subject matter disclosed herein relates to remapping memory devices.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Such nonvolatile memory devices may comprise memory cells that slowly deteriorate over time, leading to an increasing probability that a read and/or write error may occur upon accessing such a memory cell. Errors may also result from manufacture defects and/or marginal memory device construction, just to name a few examples. Accordingly, an error correction process may be employed to correct such errors as they occur. For example, an error correction coding (ECC) engine may be employed in a memory device in order to correct errors generated in the memory device. Typically, such an ECC engine may be limited in its ability to correct errors. If the number of errors increases beyond such a limit, such errors may become difficult or impossible to correct. Regions of a memory device that produce such a high number of errors may be subsequently avoided during read/write processes, for example. In such a case, spare regions of the memory device may then replace such error-prone memory regions. Accordingly, a memory address directed to an error-prone memory region may be remapped to a replacement memory region.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, remap information regarding a memory device may be maintained in a storage unit external to the memory device. Such remap information may comprise remap vectors that provide a remap address to substitute for an address provided by a processor, for example, as part of a read/write request directed to the memory device. Maintaining remap information external to the memory device may provide finer-grained control of which areas of memory may be remapped. For example, such an external storage unit may allow discrete addressing to store remap vectors in relatively small portions of a memory space. In contrast, a memory device (to which the external memory is not included) may utilize block and/or sector addressing so that storing merely a single remap vector, for example, may occupy a relatively large portion of the memory device. Accordingly, storing and maintaining remap information external to such a memory device may provide a way to optimize memory space utilization of the memory device. In one implementation, a memory device may comprise a volatile memory if an external storage unit comprises a non-volatile storage unit, since remap information may be maintained in the external storage unit even during a power-down. Accordingly, externally storing and maintaining remap information may allow an increased flexibility in choosing memory type, such as NAND or NOR flash memories, SRAM, DRAM, and phase-change memory, just to name a few examples. In another implementation, a memory device may physically comprise such an external storage unit, such that a single die or integrated circuit chip comprises both a memory device and an external storage unit. In such an implementation, however, a memory device may be distinct from an external storage unit and such a memory device and external storage unit may be separately accessed through a processor and/or memory controller, for example. In other words, such an external storage unit may be processed independently of a memory device. For example, a memory device may comprise RAM that is part of a host memory which is distinct from an external storage unit comprising a disk drive: accordingly, such an external storage unit and a memory device may be individually accessed through separate processors and/or memory controllers via a bus. In another example, an external storage unit may reside on a memory device but still be distinct from such a memory device. Continuing the example, such a memory device may comprise a memory module that includes multiple memory dice: while the memory dice may be accessed via a single processor and/or memory controller, an external storage unit may be accessed through a separate processor and/or memory controller. Of course, such details and advantages of maintaining external remap information are merely examples, and claimed subject matter is not so limited.

Externally storing and maintaining remap information regarding a memory device may also result in reduced latency and/or increased use of available memory capacity compared to maintaining remap information within the memory device. To illustrate using a few examples, assuming computing power and memory bandwidth inside a memory device is a fraction of that available externally, there may be advantages to processing remap information externally. If remap information comprises a relatively large information or requires a complex algorithm to process, then significant increases in computing power may increase the speed at which remap information is found to satisfy a given request. If an external CPU and memory is faster than that available internally then the latency to lookup remap information may be much lower if using the external CPU. In one implementation, such remap information may be generated on-the-fly, for example, during run-time processes such as read/write processes initiated by a processor, wherein data read from a memory device is checked for errors, as described below. In another implementation, an initialization process may be performed by a system to include scanning for error-prone portions of a memory device. Again, such details and advantages of maintaining external remap information are merely examples, and claimed subject matter is not so limited.

In an embodiment, a memory device may comprise memory cells that slowly deteriorate over time, which may lead to an increased probability that one or more errors may occur while reading such a memory device. A memory device may also comprise defective and/or marginally functional memory cells as a result of their manufacture. Such errors may be corrected in several areas within a computing system, for example, using error correction codes (ECC) or other such algorithms. From a system perspective, a determination may be made as to whether or not to continue to utilize such error-prone cells. As will be explained in further detail below, such a determination may be based, at least in part, on a comparison of the number of such errors to an error threshold, which may be defined during a design stage of a memory device, for example. In one implementation, use of particular memory cells may be discontinued before such cells display an excess number of errors. In other words, use of error-prone memory cells may be discontinued if such memory cells produce a number of errors that approaches an error threshold. Such a threshold need not be reached, for example, in order to determine that use of memory cells may be discontinued. Accordingly, observing a number of errors approaching an error threshold may be a way to predict that particular memory cells may soon produce too many errors, so use of such error-prone memory cells may be stopped before the memory cells actually begin to critically malfunction, for example. If use of particular memory cells is to be discontinued, then replacement memory cells may be selected in a manner that maintains an overall memory device capacity.

Accordingly, in one embodiment, a process to maintain a size capacity of a memory device may include remapping an error-prone memory location to a properly functioning memory location, without a loss of overall system memory space (e.g., storage device capacity). Such remapping may be based, at least in part, on information regarding a quantity and/or frequency of errors occurring as a result of reading from an error-prone memory location. Here, memory location refers to a portion of a memory device that may be accessed, e.g., via a read and/or write process, using an address or addresses to identify such a memory location and/or portion. As explained in further detail below, an ECC engine, for example, may be used to determine a bit error rate and/or the number of bit errors associated with reading a particular portion of a memory. Subsequently, the bit error rate and/or number of bit errors may be compared to an error threshold, which may comprise a substantial limit to an acceptable number of errors, for example. Depending on an outcome of such a comparison, a decision may be made regarding whether to retire, e.g., discontinue use of, the particular portion of memory producing the errors.

In a particular embodiment, a process of retiring a portion of a memory device may include moving digital signals representative of data stored in the to-be-retired portion of the memory device to another portion of the memory device. In one implementation, such digital signals representing data relocated from a retired portion of a memory device may be moved to a spare portion of the memory device. For example, such a spare portion of memory may include a physical location of the memory device not initially recognized or considered as part of the full capacity of the memory device, as explained in more detail below. A process of retiring a portion of a memory device may also include remapping an address of a to-be-retired portion of the memory device to correspond to an address of a new, spare portion of the memory device. Such remapped addresses may be stored in a storage unit external to the memory device, for example, as explained in detail below. Of course, such processes are merely examples, and claimed subject matter is not so limited.

In one embodiment, a process such as that described above may involve a memory device comprising a phase-change memory (PCM) device. Accordingly, as a PCM ages, a bit error rate and/or a number of bit errors produced by portions of the PCM may increase. Such errors, to some extent, may be corrected using an ECC engine and/or other such error correcting techniques, for example. However, a number of errors may increase beyond a capability of such error-correcting techniques. Therefore, it may be desirable to retire such memory portions upon an indication of a trend that such memory portions have been or are beginning to produce an excessive number of errors.

Embodiments, such as those described above, may allow successful use of storage devices involving relatively less reliable technologies. For example, a die previously considered unusable may be employed using embodiments described herein. Also, such embodiments may extend a lifetime of a storage device to that of a majority of its memory cells rather than the life of a relatively few of its memory cells.

Figure 1:
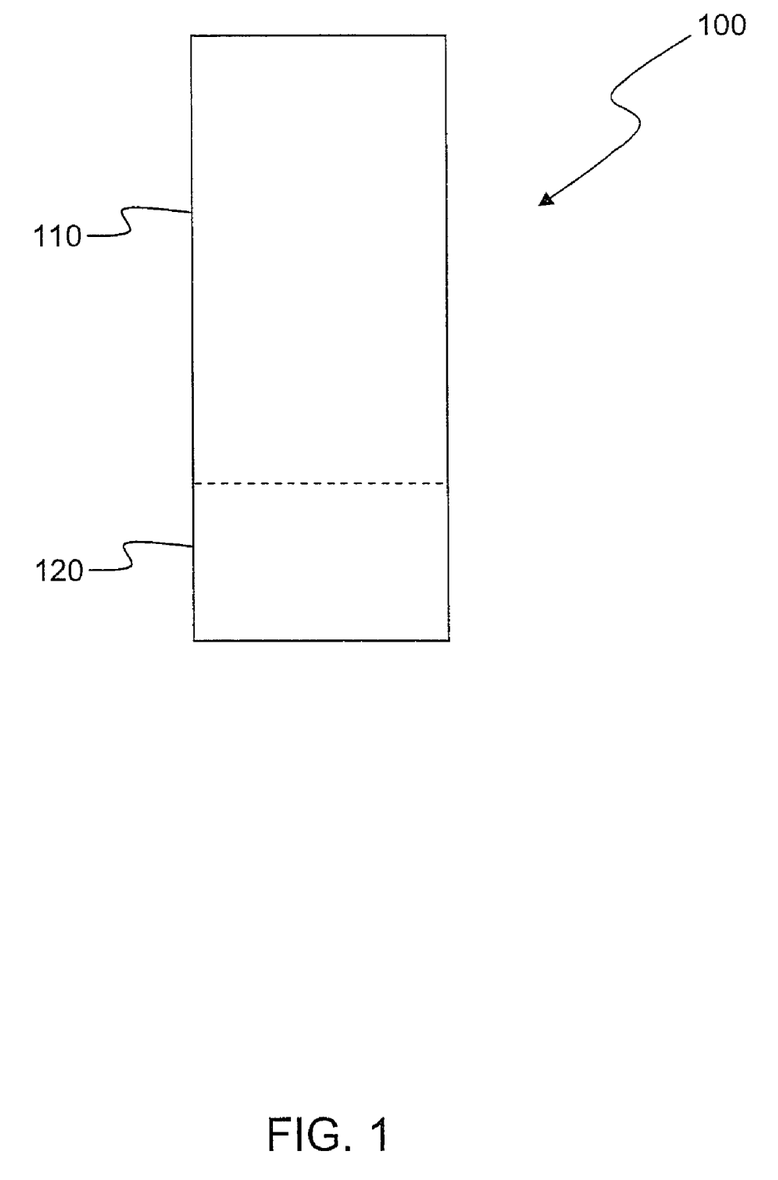
FIG. 1 is a schematic view of a memory configuration, according to an embodiment.

FIG. 1 is a schematic view of a memory configuration, according to an embodiment. A memory device 100 may be partitioned into a main memory 110 and a spare memory 120. Memory device 100 may comprise NAND or NOR flash memories, SRAM, DRAM, or PCM, just to name a few examples. Memory device 100 may comprise a user-addressable memory space including such main and spare memory portions and/or one or more other memory portions, which may or may not be contiguous with one another, and may or may not reside on a single device. Main memory 110 and spare memory 120 may comprise independent addressable spaces that may be accessed by read, write, and/or erase processes, for example.

According to an embodiment, one or more portions of memory device 100 may store digital signals representative of data and/or information as expressed by a particular state of memory device 100. For example, an electronic signal representative of data and/or information may be "stored" in a portion of memory device by affecting or changing the state of such portions of memory device 100 to represent data and/or information as binary information (e.g., ones and zeros). As such, in a particular implementation, such a change of state of the portion of memory to store a signal representative of data and/or information constitutes a transformation of memory device 100 to a different state or thing.

Memory device 100 may be configured to initially comprise main memory 110 corresponding to the fully usable capacity of memory device 100. Such an initial configuration may additionally comprise spare memory 120 that need not be included in determining memory device capacity. However, if portions of main memory become unusable or result in an excess number of errors during read/write processes, for example, spare memory 120 may be used to replace portions of main memory 110. Of course, details of such a memory configuration are merely examples, and claimed subject matter is not so limited.

Figure 2:
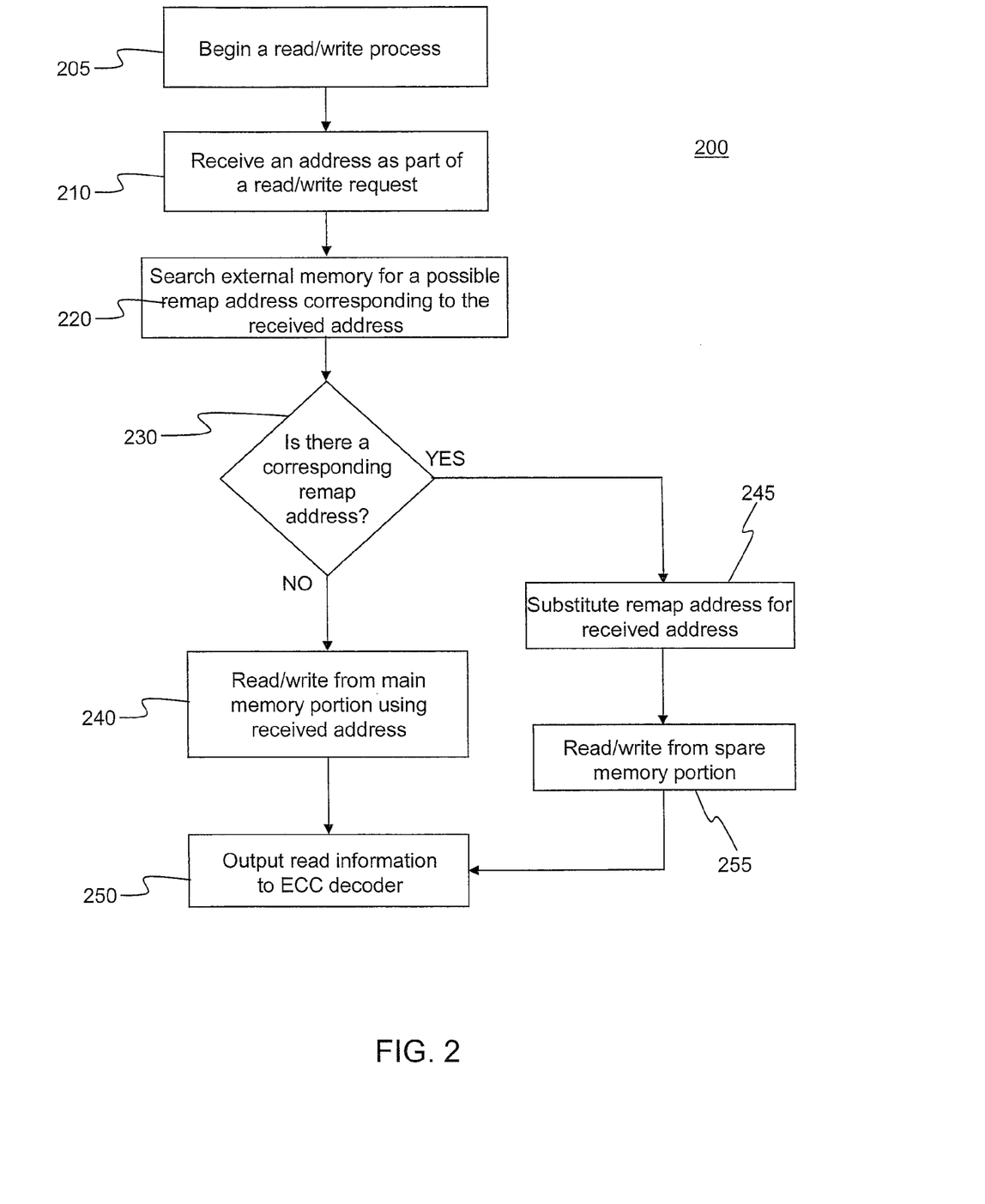
FIG. 2 is a flow diagram of a memory read/write process, according to an embodiment.

FIG. 2 is a flow diagram of a memory read/write process 200, according to an embodiment. At block 205, a read/write process to read from or to write to a portion of a memory device may be initiated, for example, by a system application that provides one or more addresses to respectively identify one or more memory locations from where stored data is to be read or to where write data is to be stored. At block 210, one or more such addresses may be provided to a controller, for example, where a search may be conducted for possible remapped addresses corresponding to the provided addresses. In one implementation, such a controller may maintain remap information regarding a memory device to which a read/write process is directed. Such remap information, for example, may comprise remap vectors to direct a read/write process to a portion of the memory device that is a substitute for a retired portion of the memory device. Such remap information may also comprise a database to track which portions of the memory device are retired and/or a table that associates original addresses with corresponding remapped addresses. Such remap information, maintained by a controller, may be stored in a storage unit or medium that is external to a memory device to which such remap information is directed. Here, a storage unit being external to a memory device means that the storage unit is operationally separated from the memory device by at least one memory controller, for example. In one implementation, remap information may be maintained on a memory device, but may be stored in such a way that it is not useful to the memory device itself. In such a case, for example, a remap table may be read from extra space on a memory device to RAM during a boot process, and subsequently update the on-device-copy as remap table contents change.

Accordingly, as at block 220, a search through externally stored remap information may be performed to find a possible remap address that corresponds to an original address included with a read/write request. As a result of such a search, a determination may be made, at block 230, whether an incoming original address is associated with a corresponding remapped address stored in the external memory. If not, wherein a search for a remapped address associated with a particular original address returned a null result, then read/write process 200 may proceed to block 240, where the original address may be used to direct the read/write process to a main portion of a memory device. Subsequently, at block 250, for a read process, data read from the original address of the memory device may be provided to error-checking hardware and/or software, such as an ECC engine, an ECC decoder, and/or other such error correcting algorithms, for example. In the case of a write process, data may be read from the original address of the memory device subsequent to a data write, in order to confirm correct storage of the data, for example. Again, data read from the original address of the memory device may be provided to error-checking hardware and/or software.

On the other hand, if a determination is made, at block 230, that an incoming original address has a corresponding remapped address, then read/write process 200 may proceed to block 245, where the remapped address may be substituted for the original address. As a result, at block 255, the remapped address may be used to read/write from/to a memory device. In one implementation, a spare portion of the memory device may be read from or written to if a remapped address is utilized, but such a limitation is merely an example. Subsequently, at block 250, data read from the remapped address of the memory device (during a read process, or during a write process to confirm stored data, as explained above) may be provided to error-checking hardware and/or software, such as an ECC engine and/or other such error correcting techniques, for example. Of course, details of such a memory process are merely examples, and claimed subject matter is not so limited.

Figure 3:
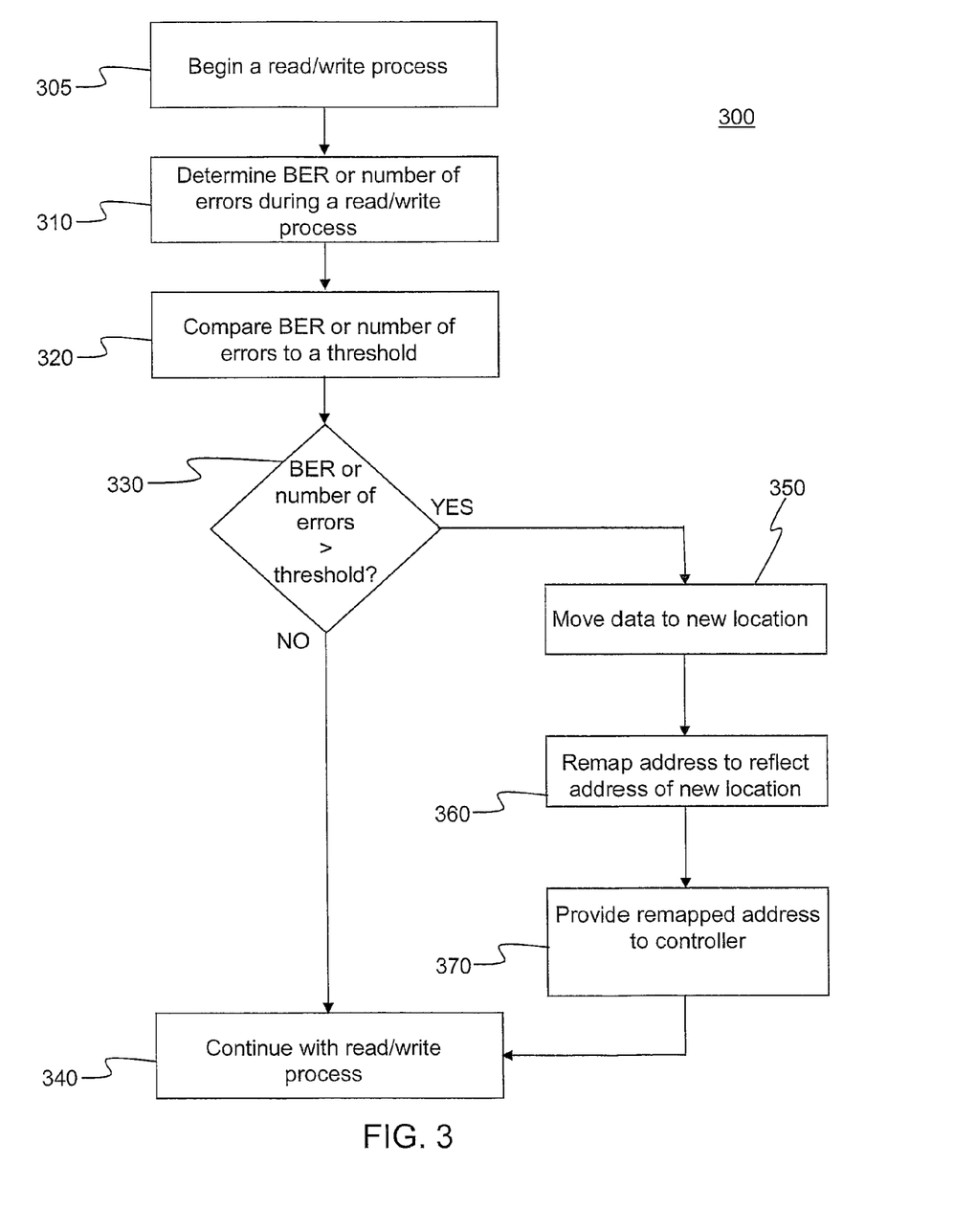
FIG. 3 is a flow diagram of a memory read/write process, according to another embodiment.

FIG. 3 is a flow diagram of a memory read/write process 300, according to an embodiment. At block 305, a read process to read digital signals representative of information stored in a portion of a memory device may be initiated, for example, by a system application that provides one or more addresses to respectively identify one or more memory locations from where stored digital signals representative of data is to be read. In the case of a write process at block 305, such a process to write digital signals representative of information to be stored in a portion of a memory device may be initiated, for example, by a system application that provides one or more addresses to respectively identify one or more memory locations to where stored digital signals representative of data is to be written. ECC hardware and/or software, by parity checking read data for example, may be used to check and/or correct errors in the data. As mentioned above, such read data may comprise recently written data in order to confirm accuracy of the writing process, for example. Subsequently, initially read data may be compared to corrected read data, thus determining the number of errors that occurred in the memory read/write process, as at block 310. Such a number of errors may be expressed as a bit error rate (BER), which may comprise a ratio of the number of error bits to the total number of read bits, for example. At block 320, a BER or number of errors resulting from reading from a portion of a memory device may be compared to an error threshold value, which may comprise a value that represents a maximum acceptable BER or maximum acceptable number of errors, beyond which, for example, additional errors may not be successfully corrected: such an error threshold value may comprise a number that represents a substantially upper limit of a BER or a number of errors that are acceptable for a particular memory device, such as memory device 100 shown in FIG. 1, for example. At or below such an error threshold value, ECC hardware and/or software may be capable of correcting read errors. But above such an error threshold, there may be a relatively high probability that at least some read errors may not be correctable, or worse, data may be lost.

At block 330, a decision is made as to whether to retire a portion of a memory device based at least in part on whether reading from or writing to such a portion of memory results in too many errors. If such a number of errors is at or below an error threshold, then read/write process 300 may continue to be directed to an original address of a memory device provided by an application that initiated the read/write process, as at block 340. On the other hand, if such a number of errors is above an error threshold, then read/write process 300 may proceed to block 350, where, for example, a process may begin to retire a portion of memory that leads to too many errors. In a particular implementation, data initially stored in such an error-prone memory portion may be moved to another memory portion that is known to be functional and/or healthy. Such a new memory portion may comprise a portion of spare memory, such as spare memory 120 shown in FIG. 1, for example. At block 360, a memory address, or multiple memory addresses, to identify the original memory location(s) of the data may be remapped to identify the new memory portion to where data is relocated. In one implementation, remapping may comprise assigning a new address to correspond, via a vector for example, to an original address so that a call directed to the original address may be redirected to a new address specifying the location of relocated data. For a write process, remapping may comprise assigning a new address to correspond, via a vector for example, to an original address so that the write request directed to the original address may be redirected to a new address specifying the location where data is to be written.

At block 370, information regarding such remapped addresses may then be provided to an external memory maintained by a controller, as described above. After remapping an error-prone portion of memory, read/write process 300 may continue, as at block 340. Of course, details of such a memory read/write process are merely examples, and claimed subject matter is not so limited.

Figure 4:
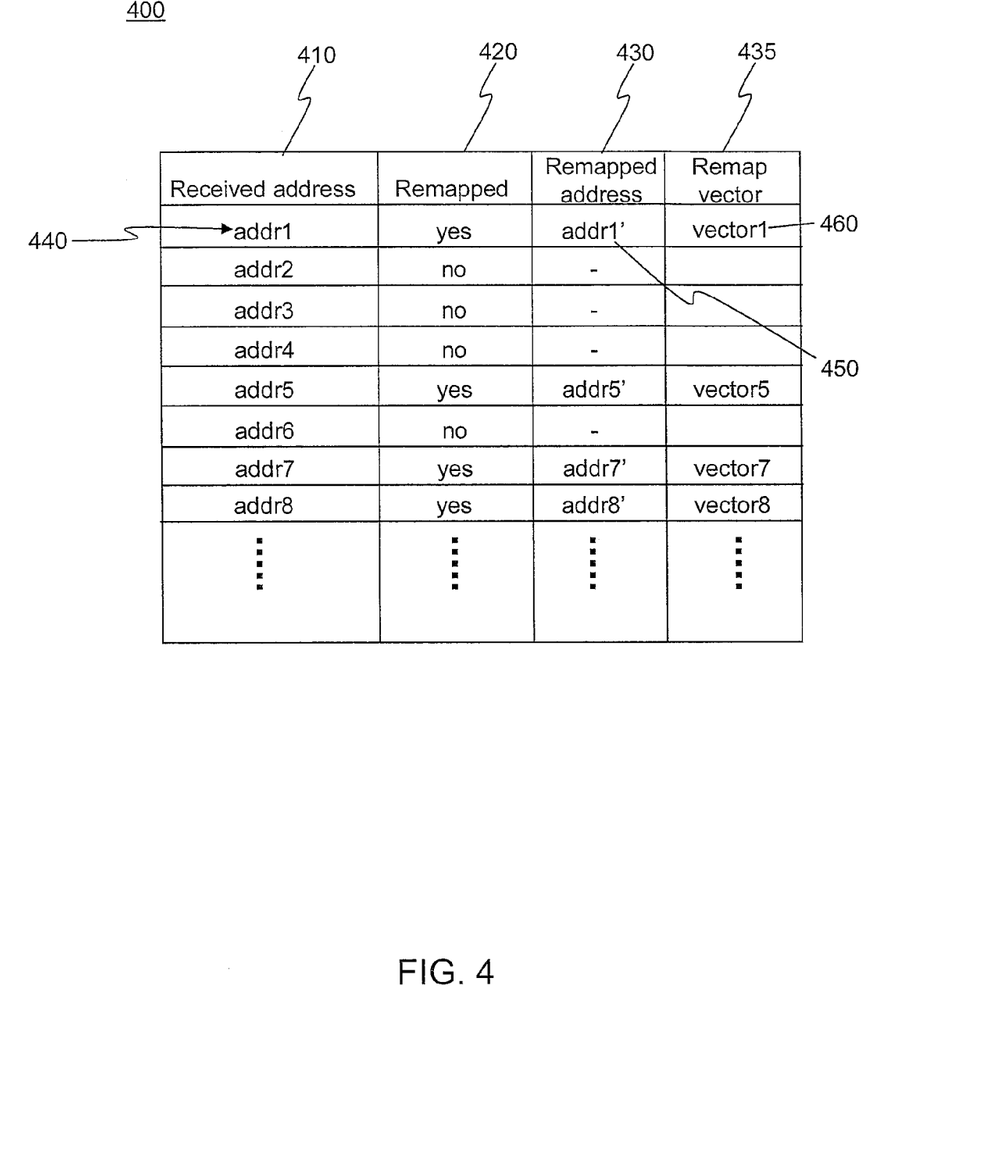
FIG. 4 is a schematic view of a vector remap table, according to an embodiment.

FIG. 4 is a schematic view of a vector remap table 400, according to an embodiment. Information included in table 400, in other implementations, need not be formatted in a table; such information, for example, may comprise an array or other techniques for organizing such information. Such information and organization regarding same, may be stored as digital signals representing such information in an external memory, for example. Column 410 may comprise a list of original addresses 440, such as addr1, addr2, addr3, and so on; status column 420 may comprise information regarding whether a corresponding original address listed in column 410 has been remapped; and column 430 may comprise a list of remapped addresses 450, such as addr1', addr2', addr3', and so on, corresponding to original addresses 440, listed in column 410.

In one implementation, original addresses 440 may comprise one or more addresses included in a read request by an application and/or system inquiring about information stored in memory device 100 at the location of the one or more addresses. Similarly, original addresses 440 may comprise one or more addresses included in a write request by an application and/or system requesting a process to store information in memory device 100 at the location of the one or more addresses. Status column 420 may comprise metadata to describe whether an original address 440 has been remapped. If such remapping has occurred, then column 430 may comprise a remapped address 450 corresponding to an original address 440. To illustrate by an example according to FIG. 1, addr1, addr5, addr7, and addr8 have been remapped to addr1', addr5', addr7', and addr8', respectively, while addr2, addr3, addr4, and addr6 have not been remapped. Here, original addresses that have not been remapped have no corresponding remapped address in column 430. In another implementation, status column 420 need not be included in table 400 since a presence of a remapped address 450 may be sufficient to indicate that remapping has occurred for a particular original address 440, for example. In yet another implementation, remap information, included in column 435 for example, may be included within a read request. For example, a driver may receive a logical address and subsequently forward a physical address and a vector 460 to a memory device. Such a vector may comprise information to allow the memory device to internally decode a read operation. Such a vector may also be used for ECC, for example. Of course, details of such a vector remap table and other formats of storing remap information are merely examples, and claimed subject matter is not so limited.

Figure 5:
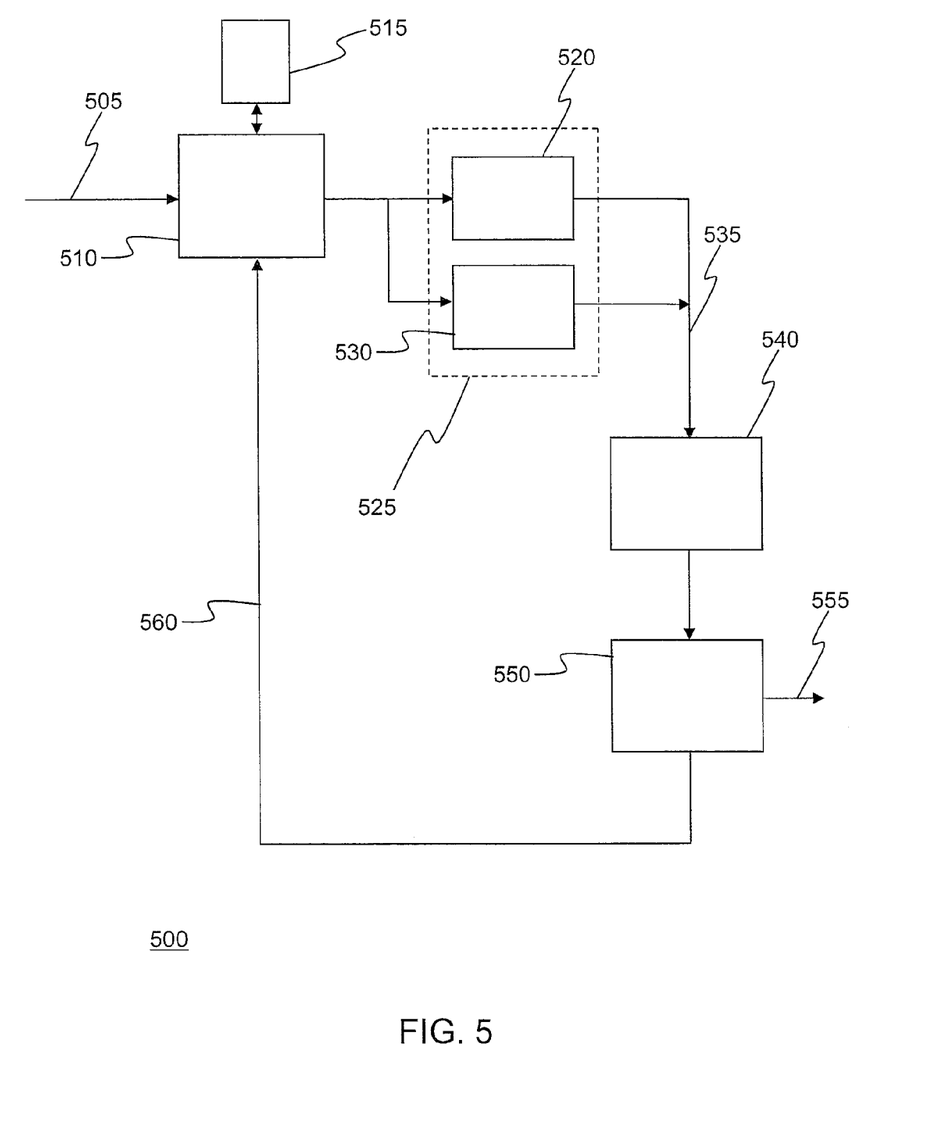
FIG. 5 is a schematic block diagram of a memory system, according to an embodiment.

FIG. 5 is a block diagram of a memory system 500, according to an embodiment. A controller 510 may be configured to receive one or more signals indicative of a read/write request 505 that comprises an address specifying a location of a memory device 525 where data is to be read or written. Memory device 525 may comprise main memory 520 and spare memory 530, as described above, for example. Controller 510 may compare incoming addresses accompanying read/write requests with contents stored in external memory 515, which may include remapped addresses associated with original addresses. External memory 515 may be operationally separated from memory 525 by controller 510, for example. Using such a comparing process, controller 510 may determine whether read/write request 505 comprises an address that has been remapped. Depending on such a determination, controller 510 may direct read/write request 505 to either main memory 520 or spare memory 530 to read or write data. For example, if the address of read/write request 505 has not been remapped, then controller 510 may forward the read/write request to main memory 520, whereas if such an address has been remapped, then controller 510 may modify read/write request 505 to comprise a remapped address that may be directed to spare memory 530. Subsequently, either main memory 520 or spare memory 530 may provide read data 535 to an error detection block 540, which may comprise an error counter and/or an ECC engine, for example. In one embodiment, error detection block 540 comprising an ECC engine may be disposed in a die element of memory device 525. In another embodiment, error detection block 540 comprising an ECC engine may be provided at a system level, such as in an application, for example. Error detection block 540 may detect and/or correct any errors present in read data 535, and may express such detected errors as a BER and/or number of bit errors. Accordingly, error detection block 540 may provide corrected read data 545 to an entity that introduced read/write request 505, such as an application and/or host system. Error detection block 540 may also provide information regarding the number of errors present in read data 535 to a compare engine 550. In the case where error detection block 540 comprises an ECC engine disposed in a die element of memory device 525, such error information may be accessible by a compare engine application at a system level. In one implementation, for example, an ECC engine may include an error information register available for access by compare engine 550, which may compare the number of detected errors to an error threshold.

As explained above, such an error threshold may comprise a limit on an acceptable BER or number of errors. Compare engine 550 may provide results 560 of such a comparison to controller 510. Based at least in part on such comparison results, controller 510 may determine whether to retire a particular portion of memory device 525. If such a comparison indicates that a particular portion of memory device 525 resulted in an excess number of bit errors during a read/write process, for example, then controller 510 may initiate a process to retire the error-prone portion of memory. Such a retiring process may include relocating data stored in the retiring portion of memory to another portion of memory. For example, digital signals representative of data may be moved from a particular portion of main memory 520 to be stored in spare memory 530. Accordingly, controller 510 may modify an address that identified the retiring portion of memory to an address that identifies the new portion of memory to contain the relocated data. Such a modified, remapped address may then be written into external memory 515, where it may be associated with the original address, as described above. Of course, such an implementation of a memory system is merely an example, and claimed subject matter is not so limited.

Figure 6:
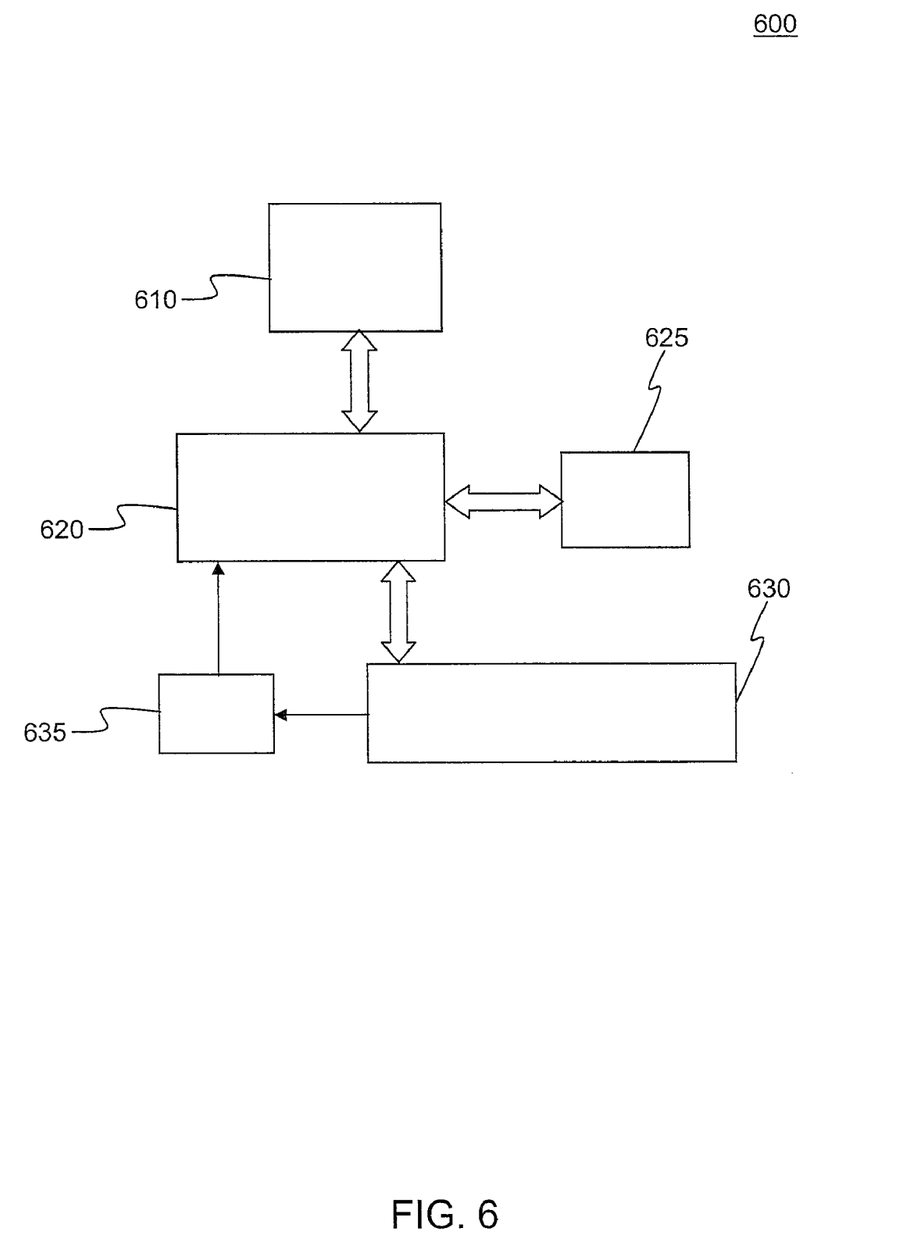
FIG. 6 is a schematic block diagram of a memory system, according to another embodiment.

FIG. 6 is a schematic block diagram of a system 600, according to an embodiment. A user application may be implemented in a processor 610 to provide a read or write request to controller 620. As indicated above, such a read/ write request may accompany an original read or write address. In one implementation, controller 620 may compare an original read or write address to remap information stored in external memory 625, which may include a table listing original read/write addresses and corresponding remapped read/write addresses, for example. Accordingly, controller 620 may provide to memory 630 a read/write request comprising an original read/write address or a remapped read/write address, depending, at least in part, on whether a particular original read/write address has been remapped. External memory 625 may be operationally separated from memory 630 by controller 620, for example. Memory 630 may comprise a main memory portion and/or a spare memory portion, as shown in FIG. 1 for example. In one particular implementation, memory 630 may provide read data to an ECC engine 635, which may comprise an error counter and/or an ECC engine, for example. In one embodiment, ECC engine 635 may be disposed in a die element of memory 630. ECC engine 635 may detect and/or correct any errors present in read data, and may express such detected errors as a BER and/or number of bit errors, for example. Accordingly, ECC engine 635 may provide corrected read data to processor 610 and also provide information regarding the number of errors present in read data to controller 620. In turn, controller 620 may, based at least in part on the number of such errors, determine whether to retire a particular portion of memory 630 using one or more remap processes described above, for example. Remap information resulting from such remap processes may then be stored in external memory 625. Of course, such an implementation and configuration of a memory system is merely an example, and claimed subject matter is not so limited.

Figure 7:
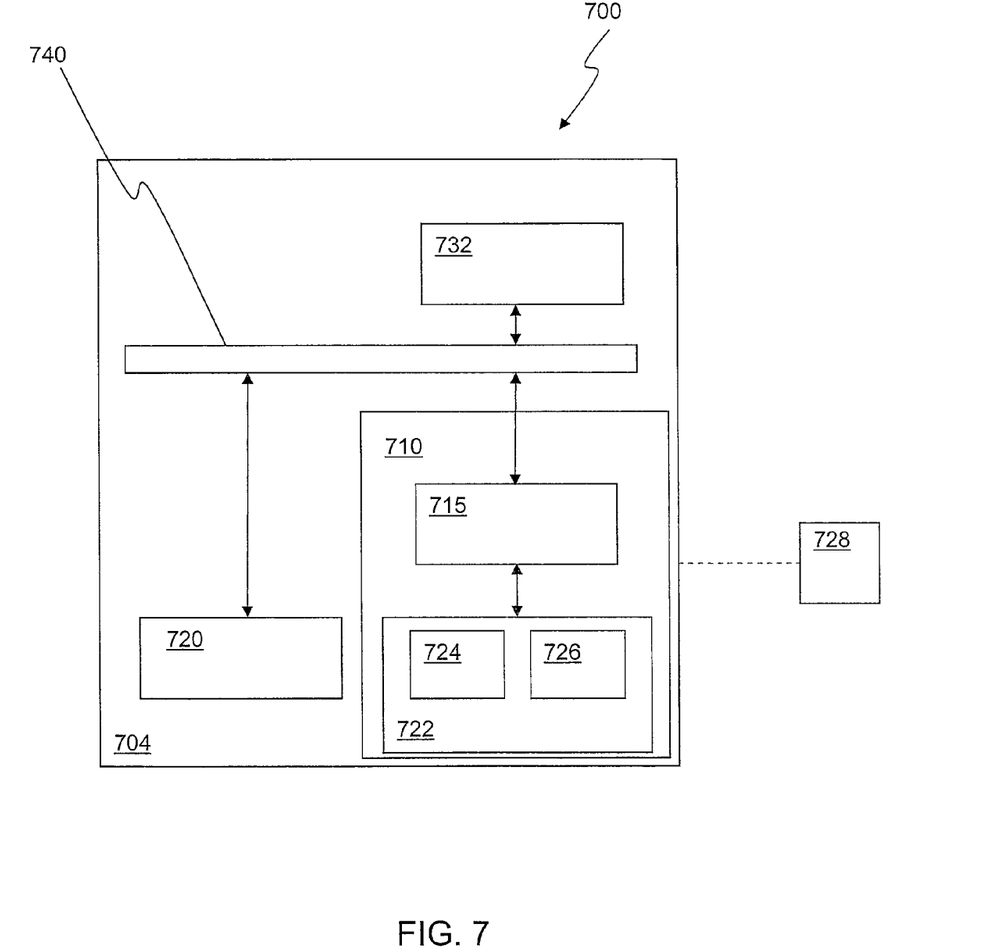
FIG. 7 is a schematic block diagram of a computing system and a memory device, according to an embodiment.

FIG. 7 is a schematic diagram illustrating an exemplary embodiment of a computing system 700 including a memory device 710, which may be partitioned into main and spare portions as discussed above, for example. A computing device 704 may be representative of any device, appliance and/or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may communicate with memory controller 715 to process memory-related operations, such as read, write, and/or erase, as well as memory partition processes discussed above, for example. Processing unit 720 may include an operating system configured to communicate with memory controller 715. Such an operating system may, for example, generate commands to be sent to memory controller 715 over bus 740. Such commands may include instructions to partition at least a portion of memory 722, to associate one or more attributes to particular partitions, and to program a particular partition based at least in part on the type of data to be programmed and stored, for example.

Memory 722 is representative of any data storage mechanism. Memory 722 may include, for example, a primary memory 724 and/or a secondary memory 726. In a particular embodiment, memory 722 may comprise memory that may be partitioned based at least in part on one or more attributes of the memory and/or a memory management process, as described above. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code and/or instructions for one or more of the devices in system 700.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In one example, such a special purpose computer or special purpose electronic computing device may comprise a general purpose computer programmed with instructions to perform one or more specific functions. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A system comprising:
   a memory device;
   a controller to maintain remap information comprising remap vectors regarding said memory device; and
   a storage unit to store digital signals representative of said maintained remap information, wherein said storage unit is external to said memory device and said controller.

2. The system of claim 1, wherein said controller is adapted to receive one or more digital signals representative of an address of said memory device associated with a read/write request and is adapted to transmit one or more digital signals representative of a remap address to substitute for said received address in response, at least in part, to whether said remap information includes said remap address corresponding to said received address.

3. The system of claim 2, wherein said memory device comprises a main memory portion and a spare memory portion, and wherein said remap address corresponds to a memory location in said spare memory portion.

4. The system of claim 1, further comprising:
   an error correction coding (ECC) engine to detect bit errors associated with signals representative of information read from or written to said memory device, wherein said remap information is based, at least in part, on said detected bit errors.

5. The system of claim 4, wherein said memory device includes said ECC engine.

6. The system of claim 4, wherein said bit errors are responsive, at least in part, to a physical degradation of said memory device during usage of said memory.

7. The system of claim 1, wherein said storage unit comprises a non-volatile memory and said memory device comprises a volatile memory.

8. A method comprising:
   maintaining electronic digital signals representative of remap information comprising remap vectors regarding a memory device, wherein said maintaining is performed by a controller, and wherein said electronic digital signals representative of remap information are stored in a storage unit external to said memory device and said controller;
   receiving one or more electronic digital signals representative of an address of said memory device associated with a read/write request; and
   transmitting one or more electronic digital signals representative of a remap address to substitute for said received address in response, at least in part, to whether said remap information includes said remap address corresponding to said received address.

9. The method of claim 8, further comprising:
   receiving one or more electronic digital signals representative of bit error information associated with said memory device; and
   updating said electronic digital signals representative of said remap information in response, at least in part, to said received bit error information.

10. The method of claim 8, wherein said memory device comprises a main memory portion and a spare memory portion, and wherein said remap address corresponds to a memory location in said spare memory portion.

11. The method of claim 8, wherein said memory device includes an error correction coding (ECC) engine to detect bit errors associated with reading/writing from/to said memory device, wherein said electronic digital signals representative of said remap information is based, at least in part, on said detected bit errors.

12. The method of claim 11, wherein said bit errors are responsive, at least in part, to a physical degradation of said memory during usage of said memory.

13. The method of claim 8, wherein said storage unit comprises a non-volatile memory and said memory device comprises a volatile memory.

14. A system comprising:
    a memory device;

a processor to transmit read/write requests regarding said memory device;

a controller to maintain electronic digital signals representative of remap information comprising remap vectors regarding said memory device; and a storage unit to store said maintained remap information, wherein said storage unit is external to said memory device and said controller.

15. The system of claim 14, wherein said controller is adapted to receive one or more electronic digital signals representative of an address of said memory device associated with said read/write request and is adapted to transmit one or more electronic digital signals representative of a remap address to substitute for said received address in response, at least in part, to whether said remap information includes said remap address corresponding to said received address.

16. The system of claim 15, wherein said memory device comprises a main memory portion and a spare memory portion, and wherein said remap address corresponds to a memory location in said spare memory portion.

17. The system of claim 14, further comprising:

an error correction coding (ECC) engine to detect bit errors associated with reading/writing from/to said memory device, wherein said remap information is based, at least in part, on said detected bit errors.

18. The system of claim 17, wherein said memory device includes said ECC engine.

19. The system of claim 17, wherein said bit errors are responsive, at least in part, to a physical degradation of said memory during usage of said memory.

20. The system of claim 14, wherein said storage unit comprises a non-volatile memory and said memory device comprises a volatile memory.

21. The system of claim 14, wherein said remap vectors comprise remap addresses to substitute for addresses of said read/write requests transmitted by said processor.

* * * * *